United States Patent [19]

Jacobson

[11] Patent Number: 4,819,051
[45] Date of Patent: Apr. 4, 1989

[54] COMPENSATED ROTARY POSITION ENCODER

[75] Inventor: Peter E. Jacobson, Phoenix, Ariz.

[73] Assignee: Honeywell Inc., Minneapolis, Minn.

[21] Appl. No.: 68,009

[22] Filed: Jun. 29, 1987

[51] Int. Cl.$^4$ .............................................. H03M 1/22
[52] U.S. Cl. .................................. 341/13; 250/231 SE
[58] Field of Search .................. 250/231 SE, 237 G; 340/347 P

[56] References Cited

U.S. PATENT DOCUMENTS 4,641,027  2/1987  Renner et al. ................ 250/231 SE Primary Examiner—William M. Shoop, Jr.
Assistant Examiner—Richard K. Blum
Attorney, Agent, or Firm—Seymour Levine; Albin Medved; Roger W. Jensen

[57] ABSTRACT

An angular position encoder utilizes Moiré fringes formed by illuminating regions of coded images arranged circumferentially on wheels rotatable in accordance with angles to be encoded. Movement of the Moiré fringes from a reference position is detected and used to determine the angular movement. All non-rotating movements of the coded wheel are compensated by the encoding process and do not effect the output.

7 Claims, 5 Drawing Sheets

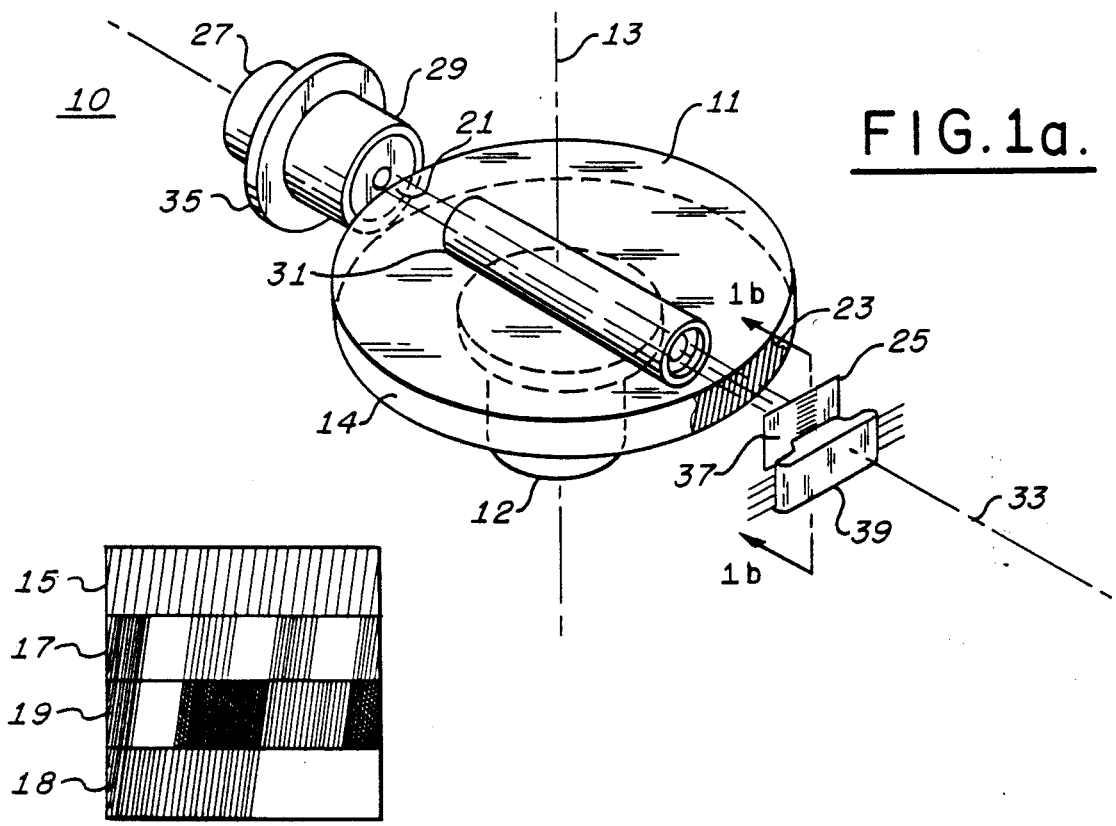
FIG.1a.
FIG.1b.
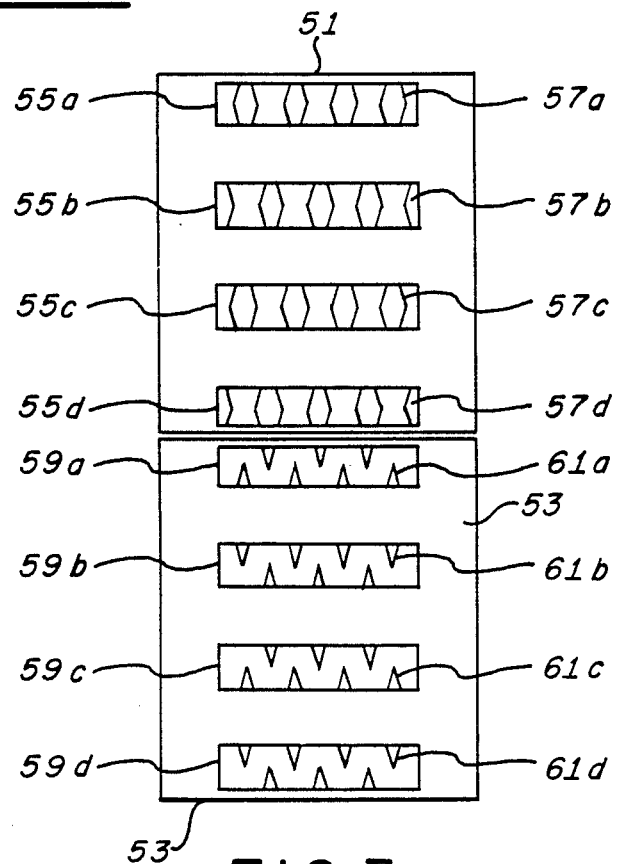
FIG.3.

COMPENSATED ROTARY POSITION ENCODER

BACKGROUND OF THE INVENTION

1. Field of the Invention

The present invention relates to rotary position sensors, and more particularly, to encoders therefor which provide digital representations of angular position, free of errors induced by non-rotational motion and component strain.

2. Description of the Prior Art

Gimbals for pointing transmitting and receiving elements in tracking and communication systems, such as those employing lasers, must be positionable with extremely high accuracies. Angular position of these gimbals, from a fixed reference point, is determined through rotary position encoders which convert angular location to coded electrical signals that are utilized to determine present angular position relative to a desired end location. To achieve the end position accuracy required for laser and other satellite communication systems, rotary position encoders first convert the angular position to a coded optical signal. This coded optical signal is utilized to generate the electrical position signal. Optical encoders of the prior art need window sizes as small as 100 microinches to establish the optical resolution required to achieve the desired angular positioning accuracies. This necessitates synthesizing schemes which exhibit great complexity, excessive size, and high cost. Various investigations of novel encoding methods have been undertaken to overcome these deficiences. Complete success, however, has eluded the investigators because of the significant error contribution provided by the uncertainty of the location of the center of rotation of the disc. Though this uncertainty may be reduced to some extent by design and assembly precision, such uncertainty reduction increases the complexity and cost of the system, thus negating the initial achievements. Additionally, errors related to temperature and life induced strain are not always reducible and further limit the accuracies obtainable with these innovations.

Photoengraving techniques, though providing significant decreases in the window size, have not resulted in direct improvement of encoder resolution since non-rotational movements of the code wheel are mixed with the rotational movement of the window. Additionally, the reduced window size reduces the travel distance to be sensed by the pick-off, thus requiring higher resolution photodetectors which add significantly to the cost.

To achieve the desired accuracies with the prior art systems, it is not uncommon to have to repeatedly assemble and disassemble an encoder until an acceptable set of geometrics has been obtained. It is also not uncommon to temperature cycle an encoder during various subassembly stages to set the disc geometrically. Should this temperature cycling result in a set position which is unacceptable the unit is disassembled, reassembled and the process is performed again until satisfactory results are obtained. These problems, not only drive the manufacturing cost up, but combine to provide a somewhat fragile end product from an environmental and equipment life standpoint.

SUMMARY OF THE INVENTION

A position encoder constructed in accordance with the principles of the present invention includes a wheel having skewed opaque regions separated by skewed transparent regions arranged on the circumference of the wheel, all regions being of equal thickness. An optical source positioned in the plane of the wheel provides an optical beam which illuminates and adds the skewed opaque and transparent regions diametrically positioned on the wheel, thus forming Moiré fringes which are translated with the movement of the wheel in an axis normal to the plane of the wheel and the light source. Movement of the Moiré fringes is digitized with appropriately positioned masks in the plane of the fringe movement. These digitized optical signals are incident to photo-electric sensors positioned in a plane behind the fringe movement plane wherefrom a digitized electrical signal representative of the wheel rotation is established. Since the movement of the Moiré fringes can be made insensitive to radial, tilt, twist and thermal movements of the code wheel and desensitized to axial shifts, the electrical signals emanating from the photoelectrical sensors provide a substantially error free indication of the wheel rotation.

BRIEF DESCRIPTION OF THE DRAWINGS

FIG. 1a is an isometric view of a preferred embodiment of the invention.

FIG. 1b is an illustration of coding that may be applied on the periphery of the wheel in FIG. 1a.

FIG. 3 illustrates the positioning of masks relative to the sets of Moiré fringes shown in FIGS. 2a through 2c.

FIGS. 5a–5d illustrate the insensitivity of the Moiré fringes to extraneous motions.

DESCRIPTION OF THE PREFERRED EMBODIMENT

Figure 2A:
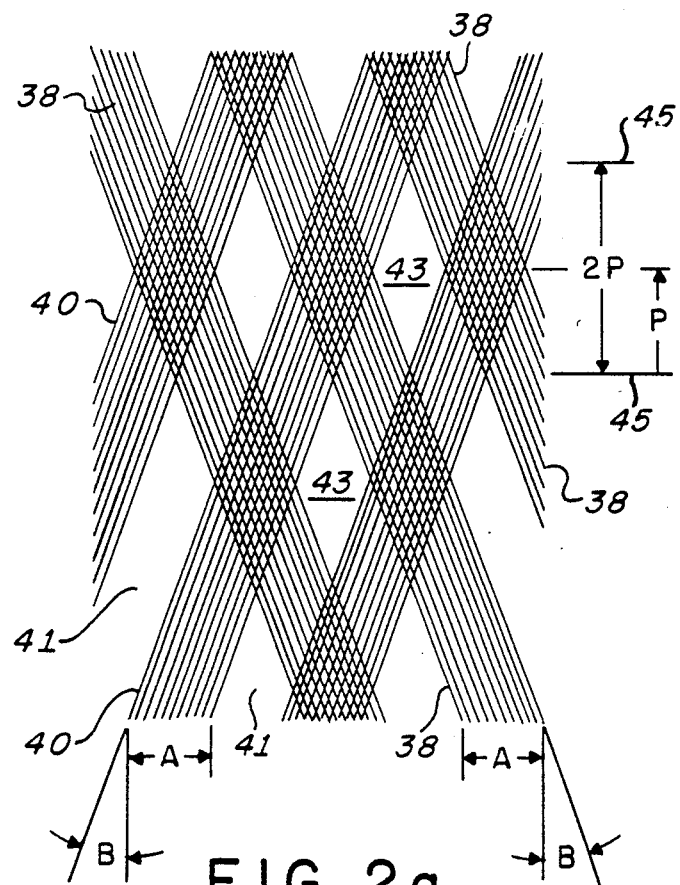
FIG. 2a is a representation of images formed in a plane perpendicular to the plane of the wheel in FIG. 1 when the light source in FIG. 1 illuminates coded regions diametrically positioned on the wheel.

A rotary position encoder in accordance with the present invention is showed generally at 10 in FIG. 1a. A code wheel 11 positioned via a set of ball bearings 12 to rotate about an axis 13 has sets of images 14, configured to represent various angular subdivisions of a position code, circumferentially arranged about the entire wheel. These codes are configured to represent various angular subdivisions of the wheel and may comprise regions of skewed bars spaced at a repetition pitch which is twice the bar width, i.e, the spacing between bars being equal to the bar width, such as the continuous arrangement 15, the skewed bars with transparent separations 17, 18 between bared regions, and the skewed bars with opaque separation 19 between bared regions, all as shown in FIG. 1b. It should be apparent that the continuous arrangement 15 provides equal opaque and transparent regions about the entire periphery of the wheel 11. A segment of an image set 21 may be superposed with a diametrically positioned segment 23 at a plane 25, external to the wheel 11, by a light source 27 in cooperation with a collimating lens 29 and a focussing lens 31 which provide a light beam along an optical axis 33. The light source 27 and collimating lens 29 would typically share a subassembly heat sink and mounting element 35. A mask 37 positioned in the plane 25 shapes and digitizes the images prior to detection by light sensitive elements 39, such as an array of photodiodes. It should be noted that the wavelength of the light provided by the light source 27 must be within the response wavelength capability of the light sensitive elements. It should be noted also that the images formed at the diametrically opposed positions 21, 23 must be real and positive with no inversions by the lens sets.

As the wheel 11 rotates about the axis 13, the diametrically opposed image sets 21, 23 move in opposite directions, and are inclined at equal and opposite angles relative to the rotation axis 13. At each angular position the superposed images form cross-hatched patterns at the plane 25, thereby establishing Moiré fringes such as those shown in FIG. 2a. Moiré fringes are formed when two identical transmission gratings, each of which consist of alternate opaque and transparent elements of equal width, are placed face to face with their rulings inclined at an angle and viewed against a bright background. No light will be transmitted where the opaque parts of one grating fall on transparent parts of the other, thus the appearance is that of periodic rows of diamond shaped light areas separated by dark fringes. In FIG. 2a, the opaque elements 38 may be in the image set 21, while the opaque elements 40 may be in the image set 23. These skewed opaque elements form rows of diamond shaped areas 43 separated by dark fringes 45, having a fringe separation 2P. Each of the opaque elements forms an angle B with the projection of the rotation axis 13 in the plane of the element and has a width A in the circumferential direction of the wheel 11. These parameters establish a pitch P in the axial direction between the rows of dark fringes 45 and the rows of light fringes 43, which is given by:

$$P = A/(2 \tan B)$$

Rotation of the wheel 11 causes relative movement between the opaque elements 38, 40 with a concomitant movement of the Moiré fringes in a direction perpendicular to the fringes themselves, i.e. along the rotation axis 13. A displacement "A" of each element between the opaque elements 38, 40, causes the fringes to move axially by a distance equal to 2P. This produces a gain G in the movement of the fringes in the axial direction, relative to the separation between the opaque elements 38, 40, that is given by:

$$G = 2P/A = 1/(\tan B)$$

Figures 2B, 2C:
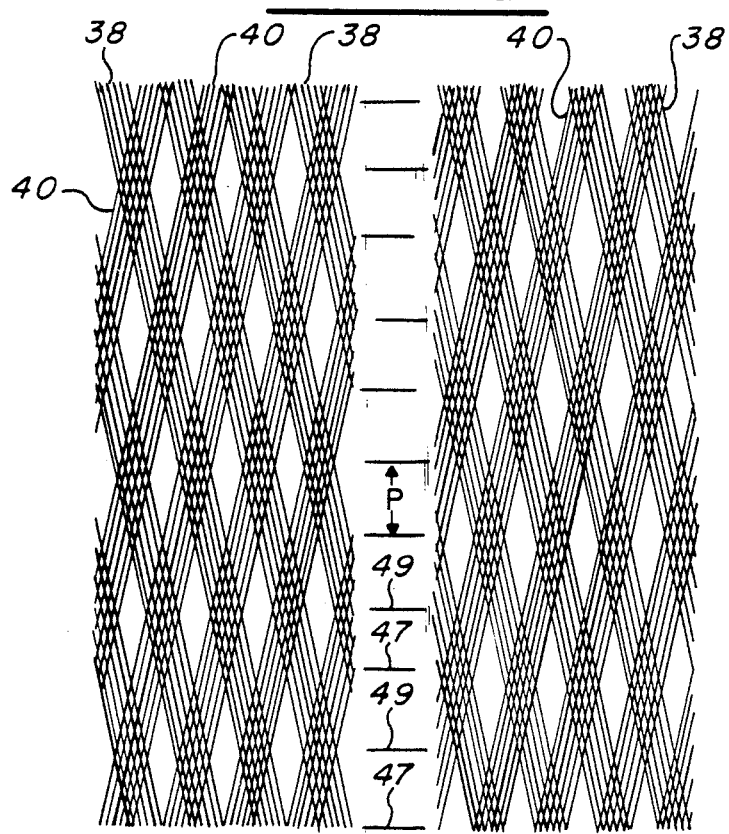
FIGS. 2b and 2c exhibit the fringes of FIG. 2a with a one-half fringe relative displacement therebetween.

This fringe movement is illustrated in FIGS. 2b and 2c, wherein FIG. 2c represents a movement of A/2 for the opaque elements 38, 40 from that represented in FIG. 2b. It is readily seen from these figures that the separation between the fringes 47 in FIGS. 2b is equal to the separation of the fringes 49 in FIG. 2c. The fringes, however, have been displaced by a distance equal to P.

A scale factor relating the fringe axial movement $Y_F$ to the angular movement of the wheel 11 may be defined as:

$$SF = Y_F/Q$$

where:
Q = angular rotation of the wheel 11
If $Y_F$ is equal to a one fringe movement and the wheel 11 has a radius r, the scale factor SF is given by:

$$SF = 2Pr/A = r/(\tan B)$$

It is evident from the last equation that the scale factor SF is linear with the radius r of the wheel 11 and is inversely proportional to the tangent of the skew angle B. When the skew angle is approximately 5.7 degrees, a gain of 10 dB is realized.

Referring now to FIG. 3, wherein images formed by the code bars and lenses of the system are viewed from the photo diode array side of mask 51 and 53. Windows 55a–55d in mask 51 have one fringe separation and are positioned for the transmission of a major portion of the light fringes 57a through 57d. The windows 59a–59d in the mask 53 have one fringe separations and are positioned at odd multiples of half a fringe distance from the windows in mask 51, thus are located in the dark fringe regions and transmit but small portions 61a–61d of the light fringes. Though the arrangement of the windows in masks 51 and 53 groups the Moiré fringes into sets of four rows each, other groupings are possible. The groupings utilized depend on the size of the fringes and parameters of the code bars 38 and 40.

Figure 4:
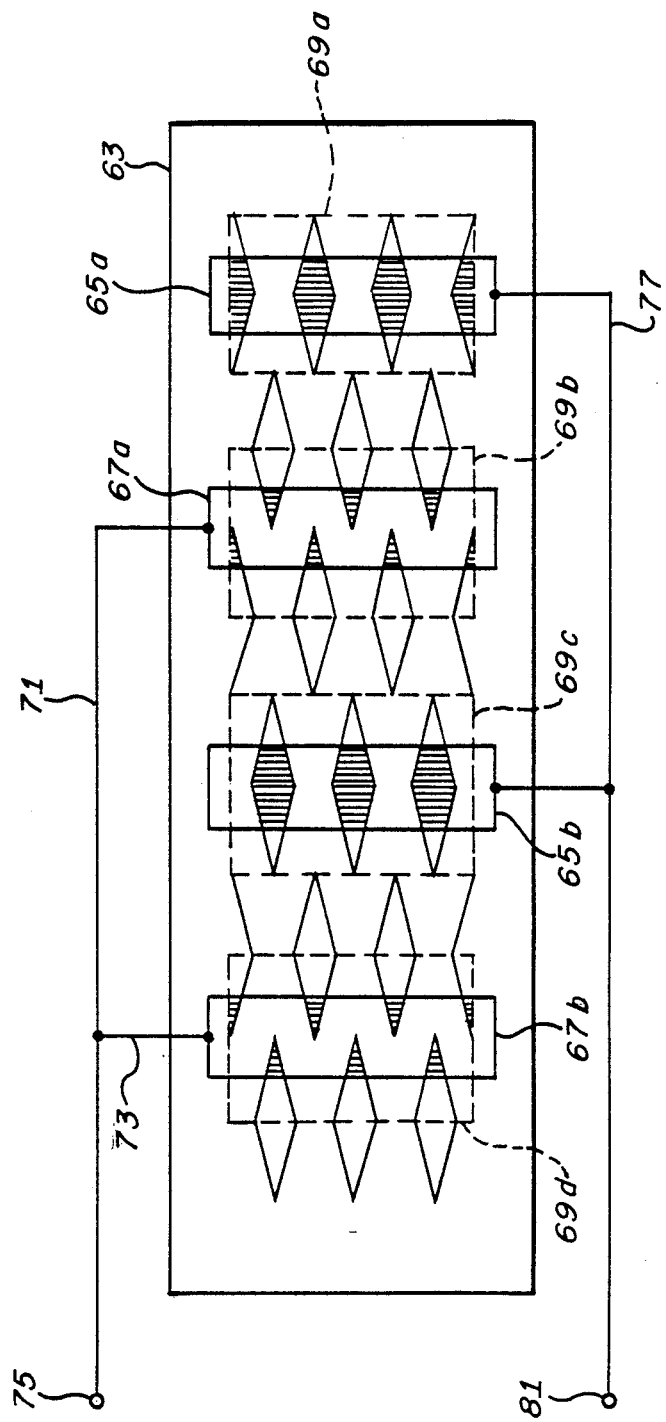
FIG. 4 is an illustration of the positioning of a photo diode array and a mask relative to the Moiré fringes.

A mask 63 with windows 65a and 65b positioned in the light fringe regions, for a reference position of the wheel, alternating with windows 67a and 67b positioned in the dark regions is shown in FIG. 4. The mask is positioned in front of a photodiode array comprising photodiodes 69a–69d. In the figure, the shaded regions represent the portions of the light fringes incident to the photodiodes, while the unshaded regions are representative of the portions of the light fringes that are blocked by the mask 63. Electrical signals coupled from photodiodes 69b and 69d via leads 71 and 73 to the terminal 75 are representative of the dark fringes for the wheel's reference position, while the electrical signals coupled from photodiodes 69a and 69c via leads 77 and 79 to terminal 81 are representative of the light fringes for the reference position. As the wheel rotates, the fringes move and the amount of light transmitted through the windows varies in accordance therewith. The electrical circuits coupled to terminals 75 and 81 may be designed to provide analog or digital representations of this light variation. These signals may be utilized to determine the position from the referenced location and the movement of the wheel.

Figure 5A:
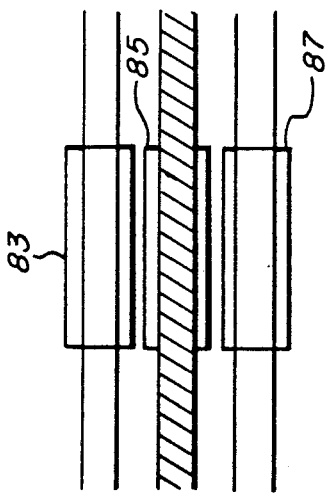

The insensitivity of the invention to radial, axial, and tilt motions is illustrated in FIGS. 5a–5d wherein the shaded strips represent the dark fringes and the unshaded strips represent the light fringes. As stated previously, the fringe motion is along the rotational axis 13 (FIG. 1a), which is represented as the vertical axis in FIGS. 5a–5d. Insensitivity to radial and lateral motion, that is along the perpendicular axis to the sheet and the horizontal axis, respectively, is illustrated in FIG. 5a. It is evident from the figure that this type of motion does not alter the light transmitted through the windows 83, 85, and 87.

Figure 5B:
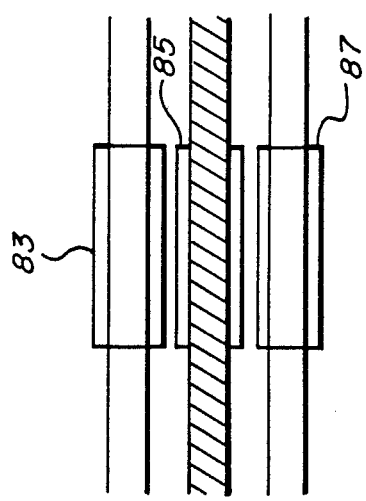

Window height and spacing is a function of the fringe width, which in turn is determined by the system gain. Consequently, though fringe movement occurs with axial motion, as illustrated in FIG. 5b, this movement causes little if any variation in the transmitted light through the windows 83, 85, and 87.

Figure 5C:
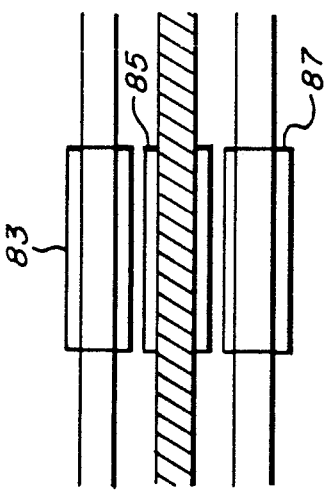
Figure 5C:
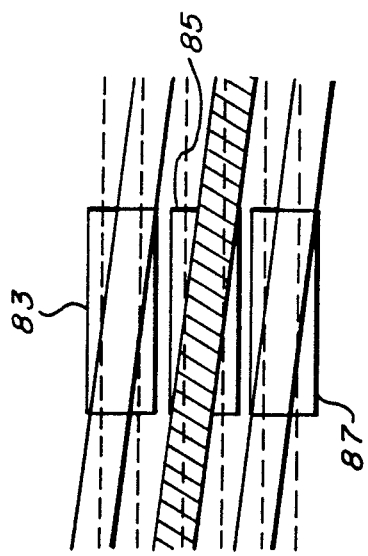

A tilting of the code wheel about the radial axis causes a skewing of the fringe pattern as illustrated in FIG. 5c, while a tilt of the wheel about the horizontal axis causes a movement of the fringe pattern similar to that due to axial motion as illustrated in FIG. 5d. In both these cases, the window height and separation established by the system gain permits motion of the fringes while maintaining substantially all of the fringe in the window area.

The major effect of thermal stress on the wheel is a diametric expansion or contraction. This diameter variation is equivalent to a radial motion of the wheel and, as illustrated in FIG. 5a, does not affect the relationship of the fringe pattern of the mask.

Figure 6:
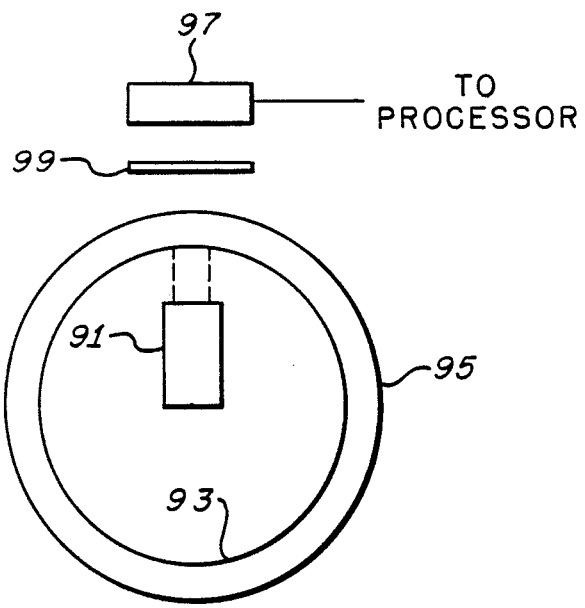
FIGS. 6 and 7 are illustrations of other embodiments of the invention.

Heretofore the invention has been described with respect to FIG. 1 wherein diametrically opposed coded images on the periphery of the wheel are superposed to form Moiré fringes. These Moiré fringes may also be created by the arrangement shown in FIG. 6. A light source 91 positioned along the diameter of two concentric wheels 93 and 95 illuminates coded images inscribed circumferentially on these wheels to form Moiré fringes which are incident to photodetectors 97 through a mask 99. In this arrangement, the circumferential coded images on the wheels have equal and opposite slant angles relative to the axis of rotation and relative angular motion of the wheels establish the fringe movements.

Figure 7:
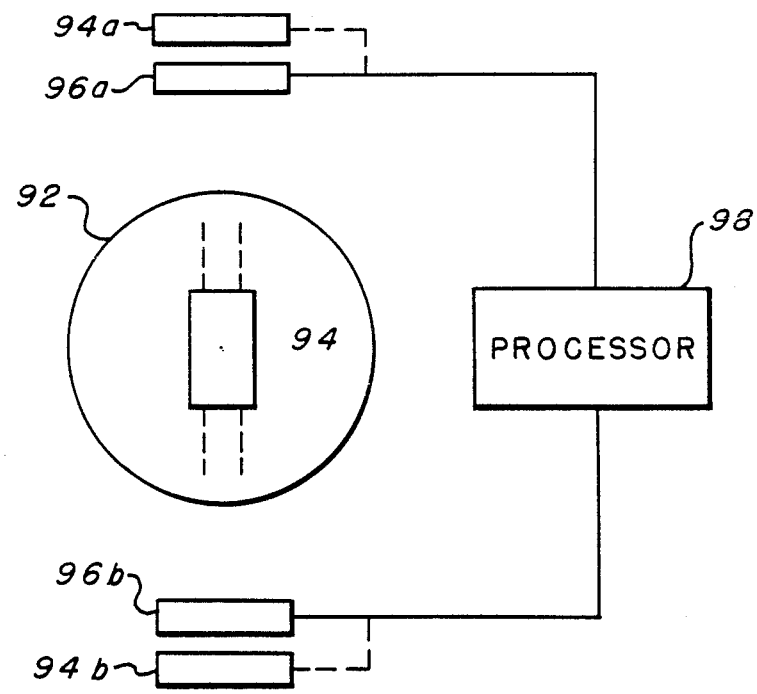

In accordance with the invention, the Moiré fringes may also be formed electronically by separately illuminating diametrically positioned regions of the circumferential coded images on a wheel 92 as shown in FIG. 7. The diametrically positioned regions are illuminated by a light source 94 and form optical images incident to photodiode arrays 96a and 96b to provide an electrical signal equivalent of the striped optical images. These electrical signal equivalents may then be coupled to a processor 98 wherein the electrical signals may be superposed to form an electrical equivalent of the optical Moiré fringes. This electrical Moiré fringe equivalent may then be further processed to determine the wheel angular position. Alternatively, the optical images formed by the coded images maybe collected with a scanning charge coupled device (CCD) 94a and 94b, such as utilized in TV cameras. Since the image representative output signals of the CCD are digitized, they maybe directly coupled to a digital computer and processed to form equivalent Moiré fringes.

While the invention has been described in its preferred embodiment, it is to be understood that the words which have been used are words of description rather than limitation and that changes may be made within the purview of the appended claims without departing from the true scope and spirit of the invention in its broader aspects.

The embodiments of the invention in which an exclusive property right is claimed are defined as follows:

1. An angular position encoder comprising:

a code wheel having coded images circumferentially arranged thereon;
   optical means for illuminating diametrically positioned regions of said coded images to establish optical images thereof; and
   means positioned to receive said optical images for providing signals representative of relative displacements of Moiré fringes formed from said optical images and thereby representative of said code wheel position and movement.

2. An angular position encoder in accordance with claim 1 wherein said optical means is positioned external said code wheel and provides a light beam along a diameter of said code wheel to illuminate said diametrically positioned regions such that said optical images are superposed to form said Moiré fringes.

3. An angular position encoder in accordance with claim 2 wherein said means for providing signals representative of relative displacements of said Moiré fringes includes means for converting optical signals incident thereto corresponding electrical signals and further comprises mask means having transparent and opaque regions positioned between said converting means and said wheel for permitting transmission of optical signals through said transparent regions for incidence to said converting means.

4. An angular position encoder in accordance with claim 3 wherein said transmission regions comprise first and second sets each having transparent regions with one fringe spacing therebetween, said transparent regions of said second set being positioned at odd multiples of one-half fringe from said transparent regions of said first set.

5. An angular position encoder in accordance with claim 4 wherein said converting means includes a photodiode array.

6. An angular position encoder in accordance with claim 1 wherein said optical means is positioned internal said code wheel and provides a first light beam to illuminate a first region of said coded images and a second light beams for illuminating a second region of said coded images diametrically positioned from said first region and wherein said means for providing signals representative of relative displacements of Moiré fringes includes first and second means for converting optical signals to electrical signals positioned, respectively, to receive optical signals from said first and second regions, and means coupled to said first and second converting means for superposing said electrical signals to form electrical equivalents of said Moiré fringes.

7. An angular position encoder in accordance with claim 6 wherein said first and second converting means include charge coupled devices for forming said electrical equivalent of said optical signals.

* * * * *